US011626345B2

(12) United States Patent
Brandenburg et al.

(10) Patent No.: US 11,626,345 B2
(45) Date of Patent: Apr. 11, 2023

(54) LIQUID COOLED MODULE WITH DEVICE HEAT SPREADER

(71) Applicant: Aptiv Technologies Limited, St. Michael (BB)

(72) Inventors: Scott D. Brandenburg, Kokomo, IN (US); David W. Zimmerman, Noblesville, IN (US)

(73) Assignee: Aptiv Technologies Limited, St. Michael (BB)

( * ) Notice: Subject to any disclaimer, the term of this patent is extended or adjusted under 35 U.S.C. 154(b) by 0 days.

(21) Appl. No.: 17/403,632

(22) Filed: Aug. 16, 2021

(65) Prior Publication Data
US 2021/0375718 A1    Dec. 2, 2021

Related U.S. Application Data

(63) Continuation of application No. 16/520,862, filed on Jul. 24, 2019, now Pat. No. 11,121,058.

(51) Int. Cl.
*H01L 23/427* (2006.01)
*H01L 23/373* (2006.01)
*H01L 23/42* (2006.01)
*H01L 23/04* (2006.01)
*H01L 23/29* (2006.01)
(Continued)

(52) U.S. Cl.
CPC ........ *H01L 23/427* (2013.01); *H01L 21/4882* (2013.01); *H01L 23/04* (2013.01); *H01L 23/293* (2013.01); *H01L 23/3736* (2013.01); *H01L 23/42* (2013.01); *H01L 23/473* (2013.01); *H01L 23/49816* (2013.01); *H05K 1/0203* (2013.01);
(Continued)

(58) Field of Classification Search
CPC ... H01L 23/427; H01L 23/04; H01L 23/3736; H01L 23/42; H01L 23/473; H01L 21/4882
See application file for complete search history.

(56) References Cited

U.S. PATENT DOCUMENTS 5,291,064 A * 3/1994 Kurokawa ............ H01L 23/473
257/E23.098
5,608,610 A    3/1997 Brzezinski
(Continued)

FOREIGN PATENT DOCUMENTS

CN    1864895    11/2006
CN    1877241    12/2006
(Continued)

OTHER PUBLICATIONS

"Advisory Action", U.S. Appl. No. 16/026,261, filed Aug. 30, 2019, 2 pages.
(Continued)

*Primary Examiner* — Marc Anthony Armand
(74) *Attorney, Agent, or Firm* — Sawtooth Patent Group PLLC

(57) ABSTRACT

An electronic device includes a printed circuit board (PCB) that supports an integrated circuit (IC) chip. The device also includes a lid over the IC chip. A thermal interface material (TIM) is configured to transfer thermal energy from the IC chip to the lid. A heat spreader forms a cavity in communication with the lid. The heat spreader is at least partially filled with a liquid that is configured to change phases during operation of the IC chip.

20 Claims, 5 Drawing Sheets

(51) Int. Cl.
  *H01L 23/473* (2006.01)
  *H01L 21/48* (2006.01)
  *H05K 1/02* (2006.01)
  *H05K 1/18* (2006.01)
  *H01L 23/498* (2006.01)

(52) U.S. Cl.
  CPC ....... *H05K 1/181* (2013.01); *H05K 2201/066* (2013.01); *H05K 2201/10378* (2013.01)

(56) References Cited

U.S. PATENT DOCUMENTS

| | | | |
|---|---|---|---|
| 6,082,443 | A | 7/2000 | Yamamoto et al. |
| 6,317,326 | B1 | 11/2001 | Vogel et al. |
| 6,528,878 | B1* | 3/2003 | Daikoku ................ H01L 23/10 |
| | | | 361/689 |
| 6,901,994 | B1 | 6/2005 | Jin-Cherng et al. |
| 6,945,317 | B2 | 9/2005 | Garner et al. |
| 7,019,971 | B2 | 3/2006 | Houle et al. |
| 7,230,832 | B2 | 6/2007 | Brandenburg et al. |
| 7,486,515 | B2 | 2/2009 | Brandenburg et al. |
| 8,074,706 | B2 | 12/2011 | Su et al. |
| 8,102,670 | B2 | 1/2012 | Sakamoto et al. |
| 8,462,508 | B2 | 6/2013 | Lankston, II et al. |
| 8,659,892 | B2 | 2/2014 | Yan et al. |
| 8,699,225 | B2 | 4/2014 | Brandenburg et al. |
| 8,813,834 | B2 | 8/2014 | Chin |
| 8,857,502 | B2 | 10/2014 | Huang |
| 9,131,630 | B2 | 9/2015 | Brandenburg et al. |
| 10,849,217 | B2 | 11/2020 | Brandenburg et al. |
| 11,121,058 | B2 | 9/2021 | Brandenburg et al. |
| 2003/0168203 | A1 | 9/2003 | Gektin et al. |
| 2003/0173059 | A1 | 9/2003 | Edelmann |
| 2004/0130022 | A1 | 7/2004 | Shizuno |
| 2005/0022975 | A1 | 2/2005 | Rosenfeld et al. |
| 2005/0098300 | A1 | 5/2005 | Kawabata et al. |
| 2005/0230085 | A1 | 10/2005 | Valenzuela |
| 2005/0280162 | A1 | 12/2005 | Mok et al. |
| 2006/0124281 | A1 | 6/2006 | Rosenfeld et al. |
| 2007/0025085 | A1 | 2/2007 | Chang |
| 2007/0090737 | A1 | 4/2007 | Hu et al. |
| 2007/0127217 | A1 | 6/2007 | Schwarz |
| 2008/0137300 | A1* | 6/2008 | Macris ................ H01L 23/433 |
| | | | 257/E23.09 |
| 2008/0190586 | A1 | 8/2008 | Robinson |
| 2009/0151905 | A1 | 6/2009 | Lai et al. |
| 2010/0071879 | A1 | 3/2010 | Hou |
| 2010/0265709 | A1 | 10/2010 | Liu |
| 2010/0309940 | A1 | 12/2010 | Lee |
| 2011/0108142 | A1 | 5/2011 | Liu et al. |
| 2014/0083653 | A1 | 3/2014 | Kempers et al. |
| 2014/0268548 | A1 | 9/2014 | Rice et al. |
| 2014/0345843 | A1 | 11/2014 | Kirkor et al. |
| 2015/0198375 | A1 | 7/2015 | Saito et al. |
| 2016/0064355 | A1 | 3/2016 | Pan et al. |
| 2016/0276308 | A1 | 9/2016 | Min et al. |
| 2016/0343639 | A1 | 11/2016 | Groothuis et al. |
| 2017/0092619 | A1 | 3/2017 | Refai-Ahmed et al. |
| 2017/0318702 | A1 | 11/2017 | Basu et al. |
| 2017/0338167 | A1 | 11/2017 | Bozorgi |
| 2018/0137300 | A1 | 5/2018 | Shi et al. |
| 2019/0014688 | A1 | 1/2019 | Weibel et al. |
| 2019/0141855 | A1 | 5/2019 | Inagaki et al. |
| 2019/0357387 | A1 | 11/2019 | Peterson et al. |
| 2020/0008291 | A1 | 1/2020 | Brandenburg et al. |
| 2021/0028088 | A1 | 1/2021 | Brandenburg et al. |

FOREIGN PATENT DOCUMENTS

| | | |
|---|---|---|
| CN | 202485508 | 10/2012 |
| CN | 203807965 | 9/2014 |
| CN | 205546384 | 8/2016 |
| CN | 106653713 | 5/2017 |
| CN | 106793685 | 5/2017 |
| CN | 107044791 | 8/2017 |
| CN | 107695318 | 2/2018 |
| WO | 2017100568 | 6/2017 |
| WO | 2018003957 | 4/2019 |

OTHER PUBLICATIONS

"European Search Report", EP Application No. 19180619.9, dated Nov. 19, 2019, 2 pages.
"Final Office Action", U.S. Appl. No. 16/520,862, filed Feb. 10, 2021, 17 pages.
"Final Office Action", U.S. Appl. No. 16/026,261, filed Apr. 3, 2020, 16 pages.
"Final Office Action", U.S. Appl. No. 16/026,261, filed Jun. 26, 2019, 13 pages.
"Foreign Office Action", CN Application No. 201910547500.X, dated Apr. 1, 2020, 19 pages.
"Foreign Office Action", CN Application No. 201910547500.X, dated May 17, 2021, 16 pages.
"Foreign Office Action", EP Application No. 19180619.9, dated Jul. 5, 2021, 10 pages.
"Non-Final Office Action", U.S. Appl. No. 16/520,862, filed Aug. 14, 2020, 12 pages.
"Non-Final Office Action", U.S. Appl. No. 16/026,261, filed Sep. 27, 2019, 13 pages.
"Non-Final Office Action", U.S. Appl. No. 16/026,261, filed Dec. 17, 2018, 9 pages.
"Notice of Allowance", U.S. Appl. No. 16/520,862, filed May 14, 2021, 9 pages.
"Notice of Allowance", U.S. Appl. No. 16/026,261, filed Sep. 14, 2020, 10 pages.

* cited by examiner

LIQUID COOLED MODULE WITH DEVICE HEAT SPREADER

CROSS-REFERENCE TO RELATED APPLICATION

This application is a continuation of and claims priority to U.S. Non-Provisional patent application Ser. No. 16/520,862, filed Jul. 24, 2019, the disclosure of which is incorporated by reference herein in its entirety.

FIELD OF INVENTION

This disclosure relates to a liquid cooling module for use with electronics devices.

BACKGROUND

Vehicle driver assistance systems utilize controllers, such as a multi-domain controllers, that have multiple integrated circuit (IC) chips. The IC chips often generate significant amounts of waste heat. Removal of the waste heat to ensure reliable operation is challenging, and next-generation IC chips are expected to generate even greater amounts of waste heat.

One approach to removing the waste heat involves use of a heat sink on the topside of the IC chip. In order to enhance heat transfer a thermal interface material is used between the IC chip and the heat sink.

SUMMARY

In one exemplary embodiment, an electronic device includes a printed circuit board (PCB) that supports an integrated circuit (IC) chip. The device also includes a lid over the IC chip. A thermal interface material (TIM) is configured to transfer thermal energy from the IC chip to the lid. A heat spreader forms a cavity in communication with the lid. The heat spreader is at least partially filled with a liquid that is configured to change phases during operation of the IC chip.

In a further embodiment of the above, the device includes an interposer board that electrically connects the PCB to the IC chip.

In a further embodiment of any of the above, the lid is secured to the interposer board by a bonding material that forms a space within which the IC chip is arranged.

In a further embodiment of any of the above, an epoxy is arranged in the space.

In a further embodiment of any of the above, the IC chip is a flip chip.

In a further embodiment of any of the above, the lid and the heat spreader are discrete elements from one another that provide an enclosure about the cavity. The heat spreader includes a perimeter wall that forms an opening in communication with the cavity. A bonding material secures the perimeter wall to the lid.

In a further embodiment of any of the above, the heat spreader includes a fill port that is sealed with a plug.

In a further embodiment of any of the above, the heat spreader is a metallic material.

In a further embodiment of any of the above, the lid includes a raised area. The TIM joins the IC chip to the raised area. The raised area is disposed in the opening.

In a further embodiment of any of the above, at least one of the lid and the heat spreader includes a roughed surface within the cavity that is exposed to the liquid.

In a further embodiment of any of the above, a venturi plate is arranged in and separates the cavity into upper and lower portions. The liquid is arranged in the lower portion. A gas phase of the liquid is arranged in the upper portion.

In a further embodiment of any of the above, the heat spreader is attached to the PCB and arranged over the lid.

In a further embodiment of any of the above, the device includes an interposer board that electrically connects the PCB to the IC chip. The lid is secured to the interposer board by a bonding material that forms a space within which the IC chip is arranged. The device further includes a sealing material that bridges an edge of the interposer board to the PCB to liquidly seal the interposer board from the cavity.

In a further embodiment of any of the above, solder balls electrically connect the interposer board to the PCB.

In a further embodiment of any of the above, the device includes an overlay arranged on the PCB. The sealing material engages the overlay. The heat spreader includes a perimeter wall that forms the opening in communication with the cavity. A bonding material secures the perimeter wall to the overlay.

In a further embodiment of any of the above, the device includes a heat exchanger that is liquidly interconnected to the cavity.

In another exemplary embodiment, a method of assembling a liquid cooled module includes providing an integrated circuit (IC) chip with a lid. The method also includes securing a heat spreader over at least a portion of the lid to form a cavity. The method further includes filling the cavity with a liquid that is configured to change phases during operation of the IC chip. The liquid contacts the lid.

In a further embodiment of any of the above, the providing step includes electrically mounting the IC chip to an interposer board and electrically connecting the interposer board to a printed circuit board (PCB).

In a further embodiment of any of the above, the securing step includes depositing a bonding material onto one of the lid and the PCB and arranging the heat spreader onto the bonding material.

In a further embodiment of any of the above, the filling step includes blocking a port in the heat spreader with the liquid in the cavity.

BRIEF DESCRIPTION OF THE DRAWINGS

The disclosure can be further understood by reference to the following detailed description when considered in connection with the accompanying drawings wherein.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible. Like reference numbers and designations in the various drawings indicate like elements.

DETAILED DESCRIPTION

Figure 1:
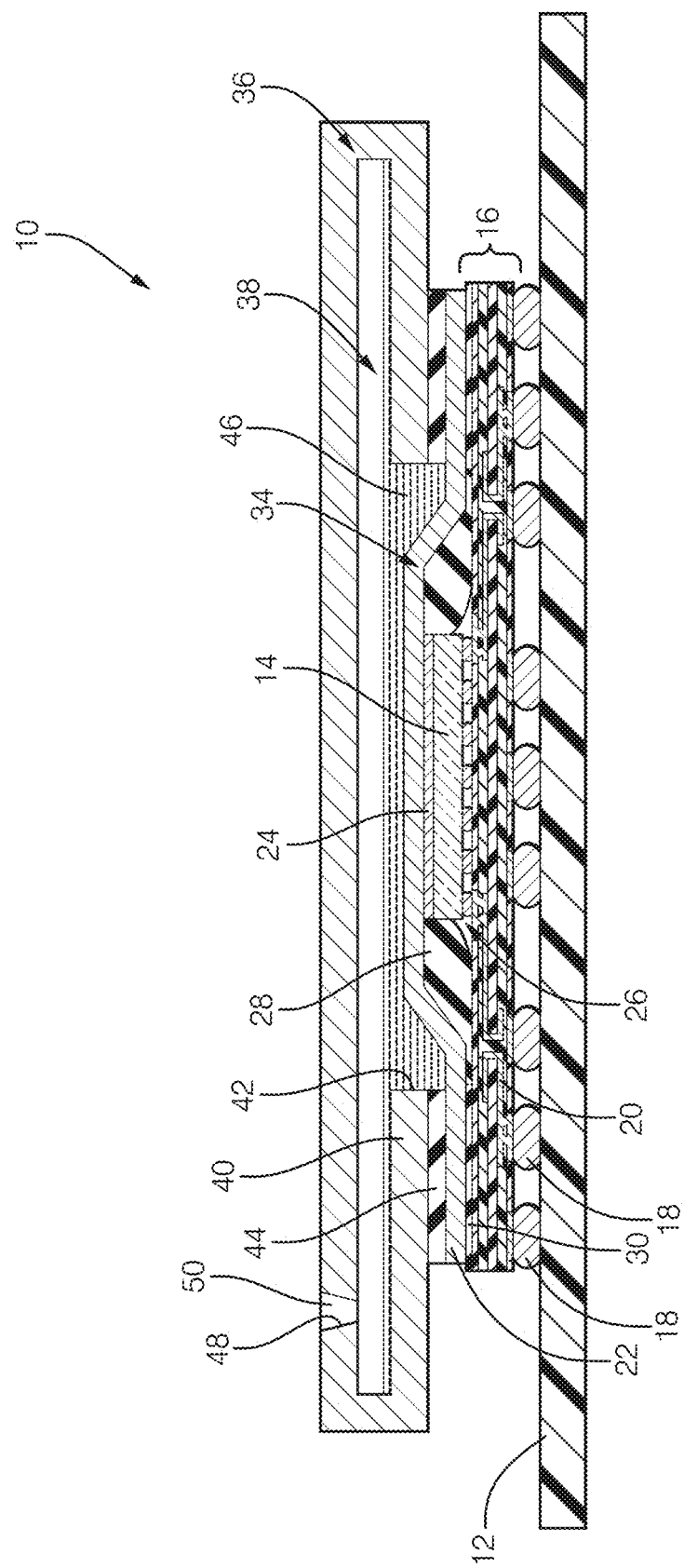
FIG. 1 illustrates an example electronic device with a liquid cooled heat spreader.

FIG. 1 illustrates an example electronic device 10 with a heat spreader used to dissipate heat. The electronic device 10 includes a printed circuit board (PCB) 12, which may be used, for example, for an advanced driver assistance system (ADAS), including a multi-domain controller, a radar, a lidar, and a camera. These components employ one or more integrated circuit chips (IC chip) that generate significant heat. It is necessary to dissipate this heat to maintain desired functionality of the electronic device. One such IC chip 14 is a flip chip mounted to an interposer board 16. The interposer board 16 is electrically connected to the PCB 12 by solder balls 18. The interposer board 16 provides electrical connections between the PCB 12 and the IC chip 14.

A lid 22, which is typically constructed from a metallic material, is arranged over the IC chip 14 and interconnected to the interposer board 16 by a bonding material 30. In one example, the lid 22 includes a raised area 34 that is thermally joined to the IC chip 14 by a thermal interface material (TIM) 24. The IC chip 14 is arranged in a space 26 beneath the raised area, which may include a material 28, such as epoxy, circumscribing the IC chip 14 and bridging the lid 22 and the interposer board 16.

A heat spreader 36 is used to remove a significant amount of heat from the IC chip 14 via the lid 22. In the example, the lid 22 and the heat spreader 36 are discrete elements from one another. The heat spreader 36 may be constructed from a metallic material, for example, such as copper, aluminum or other suitable thermally conductive material. Plastic may also be used. In one example, the heat spreader 36 forms a cavity 38 in communication with an opening 42 in the heat spreader 36 that is circumscribed by a perimeter wall 40. The raised area 34 extends through the opening 42 into the cavity 38.

The perimeter wall 40 is secured to the lid 22 by a bonding material 44, such as low melting point solder, silver filled epoxy, non-filled epoxy, or silicone. Thermal dissipation can be increased by using a solder or thermally conductive adhesive around the perimeter of the heat spreader 36.

In the example, the heat spreader 36 includes a fill port 48 for receiving a cooling fluid or liquid 46 that at least partially fills the cavity. A vacuum can be applied during the fluid injection process. The fill port 48 is blocked with a plug 50 subsequent to filling. The plug 50 may be a thixotropic epoxy, for example.

The liquid 46 is in direct contact with the lid 22. In one example, the liquid 46 has a suitable evaporation point, such as water, ethylene glycol, acetone or mixtures thereof, such that it changes phase from a liquid to a gas during typical operating temperatures of the IC chip 14. Thermal energy is transmitted from the lid 22 to the cooling fluid and from the fluid to the exterior top surface of the heat spreader 36. The fluid is heated by the device into vapor, condensing on the colder outside surfaces, and drips or wicks back to the lid 22. A coarsened surface can be added to the inside surface of the cavity (e.g., to the lid 22 and/or the heat spreader 36) to increase the fluid wicking mechanism. This can be accomplished by mold design (for die cast aluminum) or done mechanically (media blasting).

Figure 2:
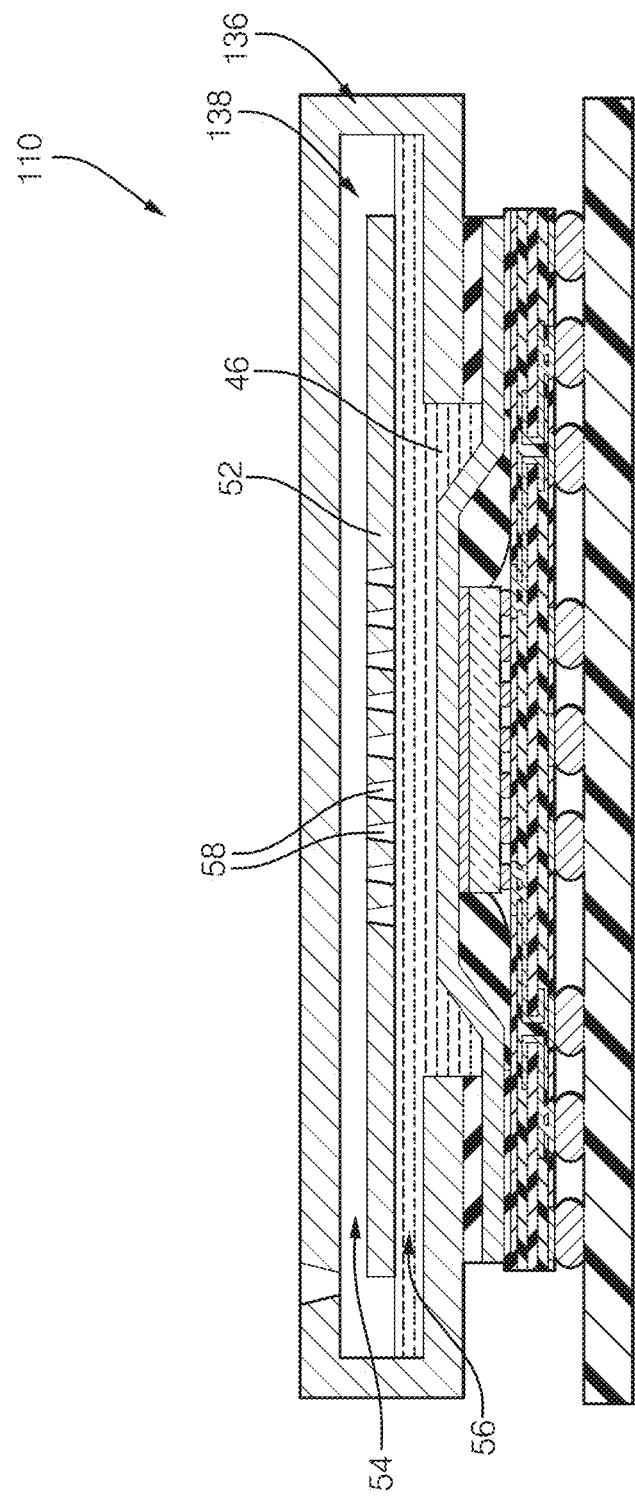
FIG. 2 illustrates another example electronic device with a liquid cooled heat spreader.

In another example illustrated in FIG. 2, the heat spreader 136 includes a venturi plate 52 having multiple venturies 58. The venturi plate 52 separates the cavity 138 into upper and lower portions 54, 56. The venturi plate 52 enhances circulation of the liquid 46 by accelerating the gaseous liquid from the lower portion 56 to the upper portion 54 as it changes phases.

Figure 3:
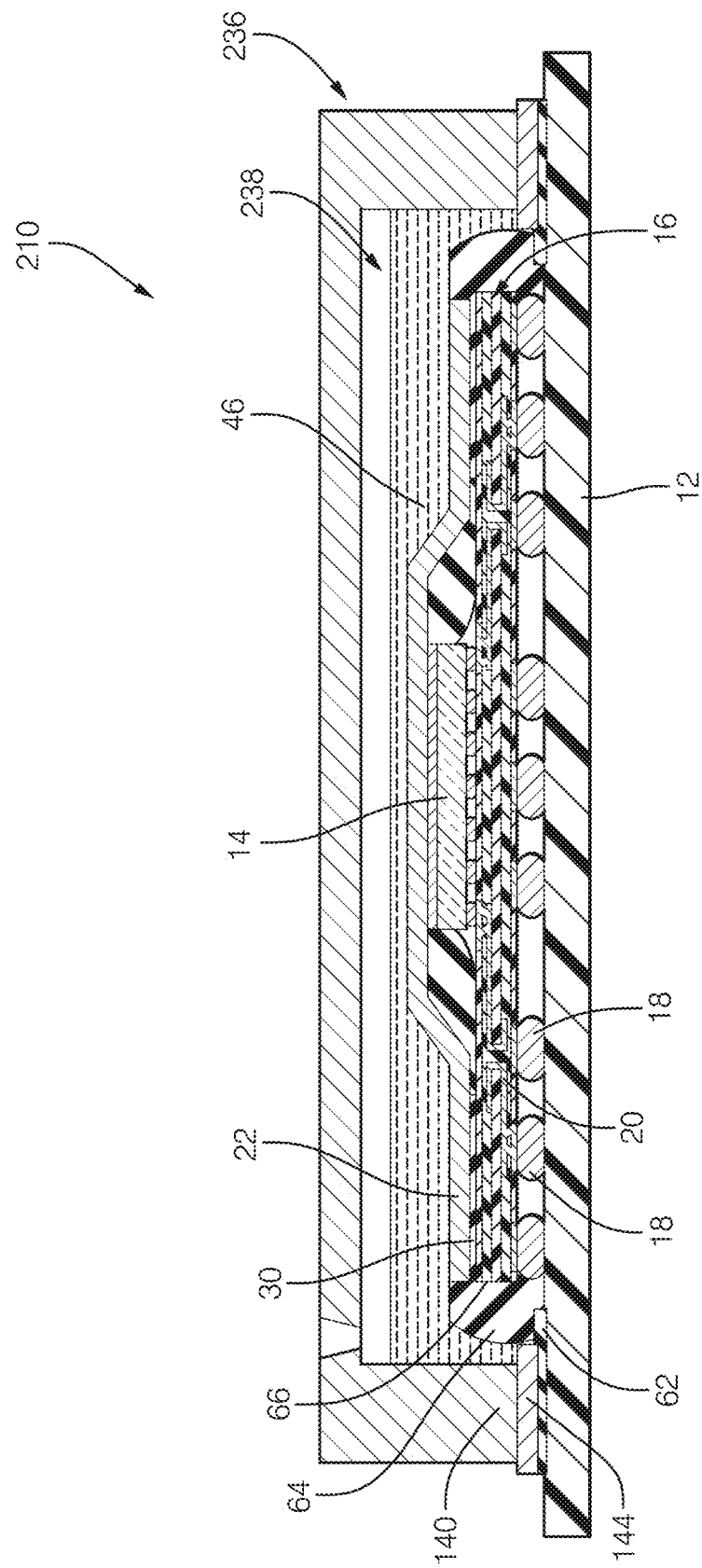
FIG. 3 depicts still another example electronic device with a liquid cooled heat spreader.

Another example electronic device 210 with a heat spreader 236 is illustrated in FIG. 3. In this example, a sealing material 64 bridges an edge 66 of the interposer board 16 to the PCB 12 to liquidly seal the interposer board 16 from the cavity 238. An overlay 62 is arranged on the PCB 12. The sealing material 64 engages the overlay 62. The heat spreader 236 has a perimeter wall 140 that forms an opening in communication with the cavity 238. A bonding material 144 secures the perimeter wall 140 to the overlay 62. In this manner, the sealing material 64 prevents the liquid 46 from migrating through the interposer board to the IC chip 14, the electrical connections 20, and/or the solder balls 18.

Figure 4:
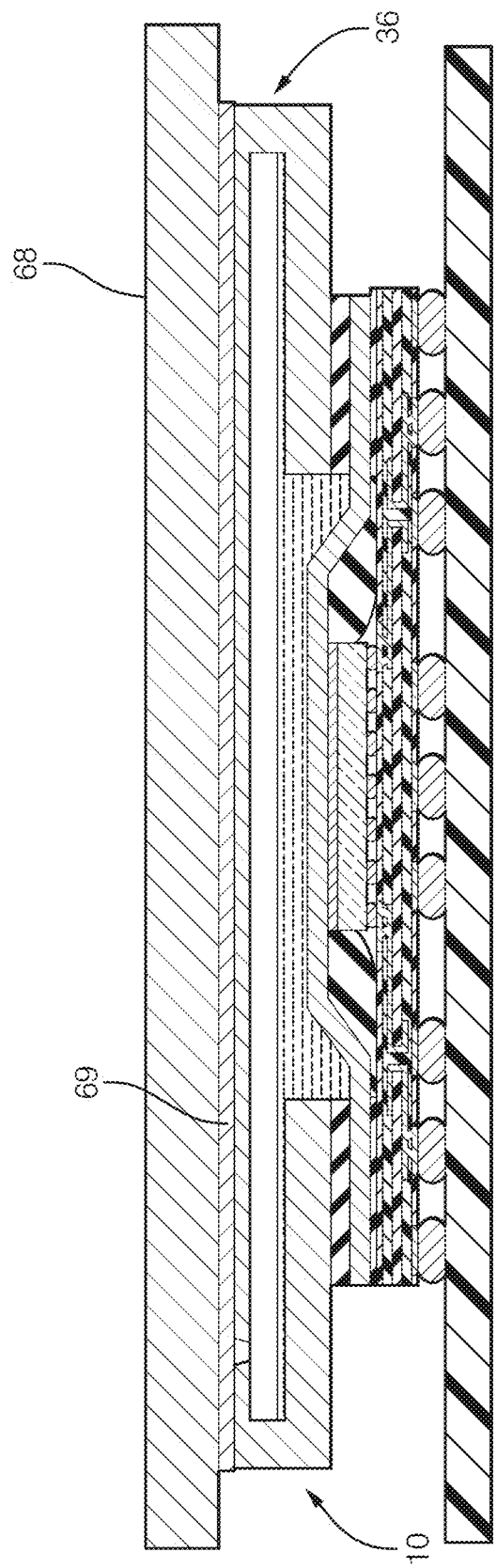
FIG. 4 illustrates the electronic devices shown in FIG. 1 with a passive heat exchanger.
Figure 5:
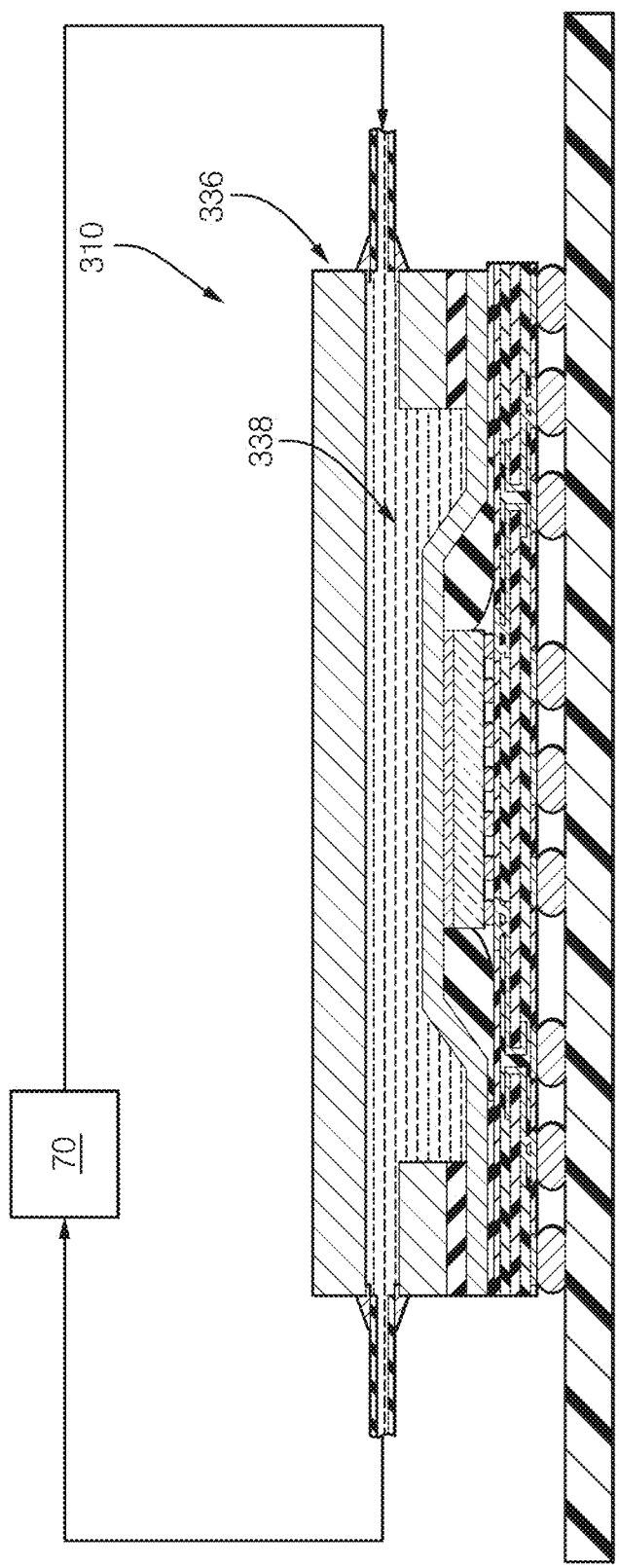
FIG. 5 depicts the electronic devices shown in FIG. 1 with an active heat exchanger.

FIGS. 4 and 5 illustrate electronic devices with heat exchangers in thermal communication with the heat spreaders. The top outside surface of the heat spreader is thermally attached to the product heat sink by a suitable thermal interface material (TIM). In the example illustrated in FIG. 4, a passive heat exchanger 68, such as a structure with cooling fins, is mounted to the heat spreader 36 using a bonding material 69, for example.

The arrangement in FIG. 5 illustrates an electronic device 310 with a liquid heat exchanger 70 in communication with the cavity 338 of the heat spreader 336. A pump may be used to circulate the fluid between the heat exchanger 70 and the heat spreader 336. The heat exchanger 70 actively cools the IC chip 14. Tubes are attached to the jacket ports of the heat spreader 336 after attachment to the PCB. An optional manifold can be incorporated for products that require multiple power devices to be cooled.

A method of assembling a liquid cooled module according to the disclosure includes providing an IC chip 14 with a lid 22. A heat spreader 36 is secured over at least a portion of the lid 22 to form a cavity 38. The cavity 38 is filled with a liquid 46 that is configured to change phases during operation of the IC chip 14. The liquid 46 contacts the lid 22. The cooling fluid is injected into the enclosure thru a fill port after the heat spreader 36 is bonded to the lid 22. With the heat spreader 36 filled with liquid 46, the port 248 may be blocked.

In one example, the IC chip 14 is electrically mounted to an interposer board 16. The interposer board 16 is electrically connected to a PCB 12. A bonding material 44 may be deposited onto the lid 22 and/or the PCB 12. The heat spreader 36 is arranged onto the bonding material 44. The heat spreader 36 can be attached to the lid 22 either before or after IC chip 14 is attached to the PCB 12.

The heat spreader 36 can spread the thermal energy up to eight times the area before the waste heat of the IC chip 14 encounters the TIM barrier (e.g., bonding material 69, FIG. 4) to the product case. Mounting orientation of the heat spreader enclosure can be vertical or horizontal in the product configuration.

It should also be understood that although a particular component arrangement is disclosed in the illustrated embodiment, other arrangements will benefit herefrom. Although particular step sequences are shown, described, and claimed, it should be understood that steps may be performed in any order, separated or combined unless otherwise indicated and will still benefit from the present invention.

Although the different examples have specific components shown in the illustrations, embodiments of this invention are not limited to those particular combinations. It is possible to use some of the components or features from one of the examples in combination with features or components from another one of the examples.

Although an example embodiment has been disclosed, a worker of ordinary skill in this art would recognize that certain modifications would come within the scope of the claims. For that reason, the following claims should be studied to determine their true scope and content.

What is claimed is:

1. A liquid cooled module with device heat spreader, the module comprising:
   a printed circuit board (PCB) supporting an integrated circuit (IC) chip;
   a lid over the IC chip;
   a thermal interface material (TIM) configured to transfer thermal energy from the IC chip to the lid;
   a heat spreader forming a cavity in communication with the lid, the heat spreader at least partially filled with a fluid configured to change phases during operation of the IC chip; and
   a heat exchanger in communication with the cavity, the heat exchanger configured to dissipate heat produced by the IC chip; and
   a pump configured to circulate the fluid between the heat spreader and the heat exchanger.

2. The liquid cooled module with device heat spreader of claim 1, comprising an interposer board electrically connecting the PCB to the IC chip.

3. The liquid cooled module with device heat spreader of claim 2, wherein the lid is secured to the interposer board by a bonding material forming a space within which the IC chip is arranged.

4. The liquid cooled module with device heat spreader of claim 3, wherein an epoxy is arranged in the space.

5. The liquid cooled module with device heat spreader of claim 3, wherein the IC chip is a flip chip.

6. The liquid cooled module with device heat spreader of claim 1, wherein the lid and the heat spreader are discrete elements from one another providing an enclosure about the cavity, the heat spreader including a perimeter wall forming an opening in communication with the cavity, a bonding material securing the perimeter wall to the lid.

7. The liquid cooled module with device heat spreader of claim 6, wherein the heat spreader includes a fill port sealed with a plug.

8. The liquid cooled module with device heat spreader of claim 6, wherein the heat spreader comprises a metallic material.

9. The liquid cooled module with device heat spreader of claim 6, wherein the lid includes a raised area, the TIM joining the IC chip to the raised area, the raised area disposed in the opening.

10. The liquid cooled module with device heat spreader of claim 1, wherein the heat spreader is attached to the PCB and arranged over the lid.

11. The liquid cooled module with device heat spreader of claim 10, further comprising an interposer board electrically connecting the PCB to the IC chip, wherein the lid is secured to the interposer board by a bonding material forming a space within which the IC chip is arranged, comprising a sealing material bridging an edge of the interposer board to the PCB to liquidly seal the interposer board from the cavity.

12. The liquid cooled module with device heat spreader of claim 11, wherein solder balls electrically connect the interposer board to the PCB.

13. The liquid cooled module with device heat spreader of claim 11, comprising an overlay arranged on the PCB, the sealing material engaging the overlay, and the heat spreader including a perimeter wall forming an opening in communication with the cavity, a bonding material securing the perimeter wall to the overlay.

14. The liquid cooled module with device heat spreader of claim 1, further comprising tubes liquidly interconnected to the cavity and the heat exchanger, the tubes configured to circulate the liquid between the cavity and the heat exchanger.

15. The liquid cooled module with device heat spreader of claim 1, wherein the liquid cooled module with device heat spreader is a part of an advanced driving assistance system of a vehicle.

16. A liquid cooled module with device heat spreader, the module comprising:
    a printed circuit board (PCB) supporting an integrated circuit (IC) chip;
    a lid over the IC chip;
    a heat spreader forming a cavity in communication with the lid, the heat spreader at least partially filled with a fluid configured to change phases during operation of the IC chip; and
    a heat exchanger in thermal communication with the cavity and configured to dissipate heat from the fluid, the heat exchanger disposed on an external surface of the cavity that is opposite the IC chip; and
    a thermal interface material (TIM) configured to transfer thermal energy from the IC chip to the lid and from the heat spreader to the heat exchanger.

17. A method of assembling a liquid cooled module with device heat spreader comprising:
    providing an integrated circuit (IC) chip with a lid;
    securing a heat spreader over at least a portion of the lid to form a cavity;
    filling the cavity with a fluid configured to change phases during operation of the IC chip; and
    providing a heat exchanger configured to dissipate heat of the fluid.

18. The method of claim 17, wherein providing the IC chip with the lid comprises electrically mounting the IC chip to an interposer board, and electrically connecting the interposer board to a printed circuit board (PCB).

19. The method of claim 17, wherein providing the heat exchanger comprises attaching the heat exchanger to an external surface of the heat spreader that is opposite the IC.

20. The method of claim 17, further comprising installing a pump configured to circulate the fluid between the cavity and the heat exchanger.

* * * * *